United States Patent [19]

Kuo et al.

[11] Patent Number: 4,475,119

[45] Date of Patent: Oct. 2, 1984

[54] INTEGRATED CIRCUIT POWER TRANSMISSION ARRAY

[75] Inventors: James R. Kuo, Cupertino; Maggie Leung, Menlo Park, both of Calif.

[73] Assignee: Fairchild Camera & Instrument Corporation, Mountain View, Calif.

[21] Appl. No.: 254,334

[22] Filed: Apr. 14, 1981

[51] Int. Cl.³ .................. H01L 27/04; H01L 23/52; H01L 29/72

[52] U.S. Cl. ...................... 357/45; 357/20; 357/36; 357/48; 357/68; 357/89

[58] Field of Search ............ 357/36, 40, 45, 68, 357/65, 51, 48

[56] References Cited

U.S. PATENT DOCUMENTS

| | | | |
|---|---|---|---|
| 3,225,261 | 12/1965 | Wolf | 357/36 |
| 3,452,256 | 6/1969 | Clarke | 357/36 |
| 3,638,202 | 1/1972 | Schroeder | 357/45 |
| 3,704,398 | 11/1972 | Fukino | 357/36 |
| 3,808,475 | 4/1974 | Buelow et al. | 357/48 |
| 4,012,764 | 3/1977 | Satonaka | 357/36 |
| 4,255,672 | 3/1981 | Ohno et al. | 357/45 |
| 4,297,597 | 10/1981 | Kimura | 357/36 |

*Primary Examiner*—William D. Larkins

*Attorney, Agent, or Firm*—Kenneth Olsen; Carl L. Silverman; Willis E. Higgins

[57] ABSTRACT

A power transistor array integrated circuit includes an array of transistors, each having an electrode connected in common to a conductive line forming a part of the integrated circuit. The electrodes of the transistors are spaced along the conductive line and have a decreasing length in a given direction along the conductive line and have a decreasing length in a given direction along the conductive line. The conductive line has a corresponding increasing width in the given direction. The decrease in length of the electrode and the increase in width of the conductive line are such that the electrodes and the conductive line form a generally rectangular shape. Differences in turn-on voltage for the transistors resulting from the differences in their electrode length tend to compensate for voltage drop in the conductive line, thus giving uniform outputs from the transistors in the array. A region forming a reverse biased P-N junction to isolate circuit elements in the integrated circuit from one another is used as part of a conductive path to circuit ground and has a surface contact region of like conductivity and more highly doped than the reverse biased P-N junction region. The integrated circuit of this invention is especially useful as a thermal printhead driver circuit.

20 Claims, 10 Drawing Figures

INTEGRATED CIRCUIT POWER TRANSMISSION ARRAY

CROSS REFERENCE TO RELATED APPLICATIONS

This application, a concurrently filed application Ser. No. 254,338, now U.S. Pat. No. 4,368,420 in the name of James R. Kuo, entitled "SUPPLY VOLTAGE SENSE AMPLIFIER", and another concurrently filed application Ser. No. 254,032, now abandoned in the name of James R. Kuo entitled "INTEGRATED CIRCUIT POTENTIAL REDUCING TECHNIQUE", are directed to related inventions. The latter application contains a common disclosure with this application.

FIELD OF THE INVENTION

This invention relates to an integrated circuit design technique. More particularly, this invention relates to a way of laying out an array of transistors and a conductive line connected to the transistors in an integrated circuit. Most especially, this invention relates to a technique by which an increased number of transistors may be provided in a given amount of area in an integrated circuit without compromising performance characteristics of the transistors. This invention also relates to a technique that reduces certain potential levels in an integrated circuit by reducing resistance of certain connections.

DESCRIPTION OF THE PRIOR ART

Since the invention of the integrated circuit, a wide variety of design techniques have been implemented for the purpose of increasing the number of circuit elements that can be provided in an integrated circuit of a given size.

Integrated circuit packages having a plurality of leads for connection to a circuit board into which the leads are plugged are provided in a relatively small number of standard sizes in order to allow the use of high volume manufacturing techniques and standardized packaging. The ability to increase the number of circuit functions that can be obtained with such packages of a given size allows significant cost reductions. The use of such standardized packages, as well as known relationships between integrated circuit chip size and yield, limit the size of integrated circuit chips.

In particular, integrated circuits having an array of power transistors which provide drive signals for other circuit elements external of the integrated circuit are known in the art. It is highly important for such arrays of power transistors to provide uniform outputs among the transistors in the array, in order to avoid differences in the operation of the circuit elements connected to receive the driving outputs of the driving transistors. This is particularly true where an array of power transistors each have their outputs connected to identical circuit elements which each must operate in the same manner.

A particular demanding application for such power transistor arrays is for driving thermal printhead elements. Such thermal printhead elements must each operate both rapidly and in an identical manner to provide printing of uniform characters at an acceptable speed. In the past, the necessity to provide identical driving signals from power transistors used to drive thermal printheads has been a significant limitation on the number of such power transistors which can be provided in an integrated circuit of a given size.

When a number of transistors in an array are each connected to a common conducting line, there is a significant voltage drop along the conducting line, which will produce variations in signals supplied to the transistors connected along the line. One approach that has been utilized in the prior art to minimize resulting variations in the outputs from such transistors has been to decrease the size of the conducting line along its length. The result is to decrease the relative resistance of the line near its beginning, thereby decreasing the voltage drop along its length.

While this approach has helped to reduce variations in output signals from the transistors in the array, it results in an array which narrows as the end of the conductive line is reached. Such a shape is very wasteful of integrated circuit area, because integrated circuits and individual circuit devices contained within them are almost uniformly provided in rectangular shapes.

It is also known in integrated circuit design to utilize a region of the circuit forming a reverse biased P-N junction for isolating circuit elements on either side of the junction as a circuit ground, in order to eliminate the use of a separate ground metallization connection. The result is a significant simplification of circuit layout, enabling a smaller chip size to be utilized. However, if dopant concentration at the surface of such an isolation region is low, the result is an unacceptably high resistance in the isolation region. Such a high resistance can interfere with proper operation of an integrated circuit when transistors close to the circuit ground are to be turned off while transistors more remote from the circuit ground are to be turned on.

Thus, while the design of integrated circuits is a highly sophisticated art, a need still remains for further improvement in the layout of an array of transistors connected in common to a conductive line.

SUMMARY OF THE INVENTION

Accordingly, it is an object of this invention to provide an array of transistors in an integrated circuit giving uniform output voltages and which is efficiently laid out in the integrated circuit.

It is another object of this invention to provide a technique for increasing the number of power transistors in an integrated circuit array, while maintaining uniformity of driving outputs.

It is a further object of the invention to provide a thermal printhead driver integrated circuit having an array with an increased number of output driver transistors, each having a uniform output voltage.

It is yet another object of the invention to provide an improved connection to circuit ground utilizing an isolation region in an integrated circuit.

It is a still further object of the invention to decrease resistance of a circuit ground connection through an isolation region of an integrated circuit, to assure proper operation of the circuit.

These and related objects may be achieved through use of the novel integrated circuit design herein disclosed. The integrated circuit in accordance with this invention has an array of transistors each having an electrode connected in common to a conductive line forming a part of the integrated circuit. The electrodes of the transistors are spaced along the conductive line and have a decreasing length in a given direction along the conductive line. The conductive line has an increasing width in the given direction. The decrease in length of the electrodes and the increase in width of the conductive line are such that the electrodes and the conductive line form a generally rectangular shape. It should be noted that changing the electrode length of the transistors along the conductive line introduces a difference in turn-on voltage drop for the transistors. By having the electrode lengths of the transistors decrease as the width of the conductive line increases, the turn-on voltage drop of the transistors tends to compensate for voltage drop in the conductive line.

In practice, in a preferred embodiment, the conducting line has extensions substantially normal to a main body of its conductive line, in a manner similar to teeth of a comb, and forming ohmic contact to emitter electrodes of the transistors. In this embodiment, the main body of the conductive line forms a first generally trapezoidal shape, having an end of relatively larger width and an end of relatively narrow width. The extensions forming the ohmic contact to the emitter electrodes, the emitter electrodes and the remainder of the transistor geometry form a second generally trapezoidal shape having complementary relatively narrow and relatively wider ends to the such ends of the first trapezoidal shape.

In another aspect of the invention, an improved integrated circuit is provided in which circuit elements are electrically isolated one from another by a reverse biased P-N junction. Electrodes of the isolated circuit elements are electrically connected by a connection in common to a first region used to form the reverse biased P-N junction. Means is provided for decreasing resistance in a conductive path including the connection and the first region. This means comprises a second region of like conductivity type as the first region, and is contained within the first region. The second region has a higher dopant impurity concentration than the first region. By making contact to the more highly doped second region, resistance in the connection is substantially reduced. This technique is particularly useful where each of the electrodes of the isolated circuit elements is connected to ground through the first and second regions.

The attainment of the foregoing and related objects, advantages and features of the invention should be more readily apparent to those skilled in the art, after review of the following more detailed description of the invention, taken together with the drawings, in which:

DESCRIPTION OF THE PREFERRED EMBODIMENTS

Figure 1:
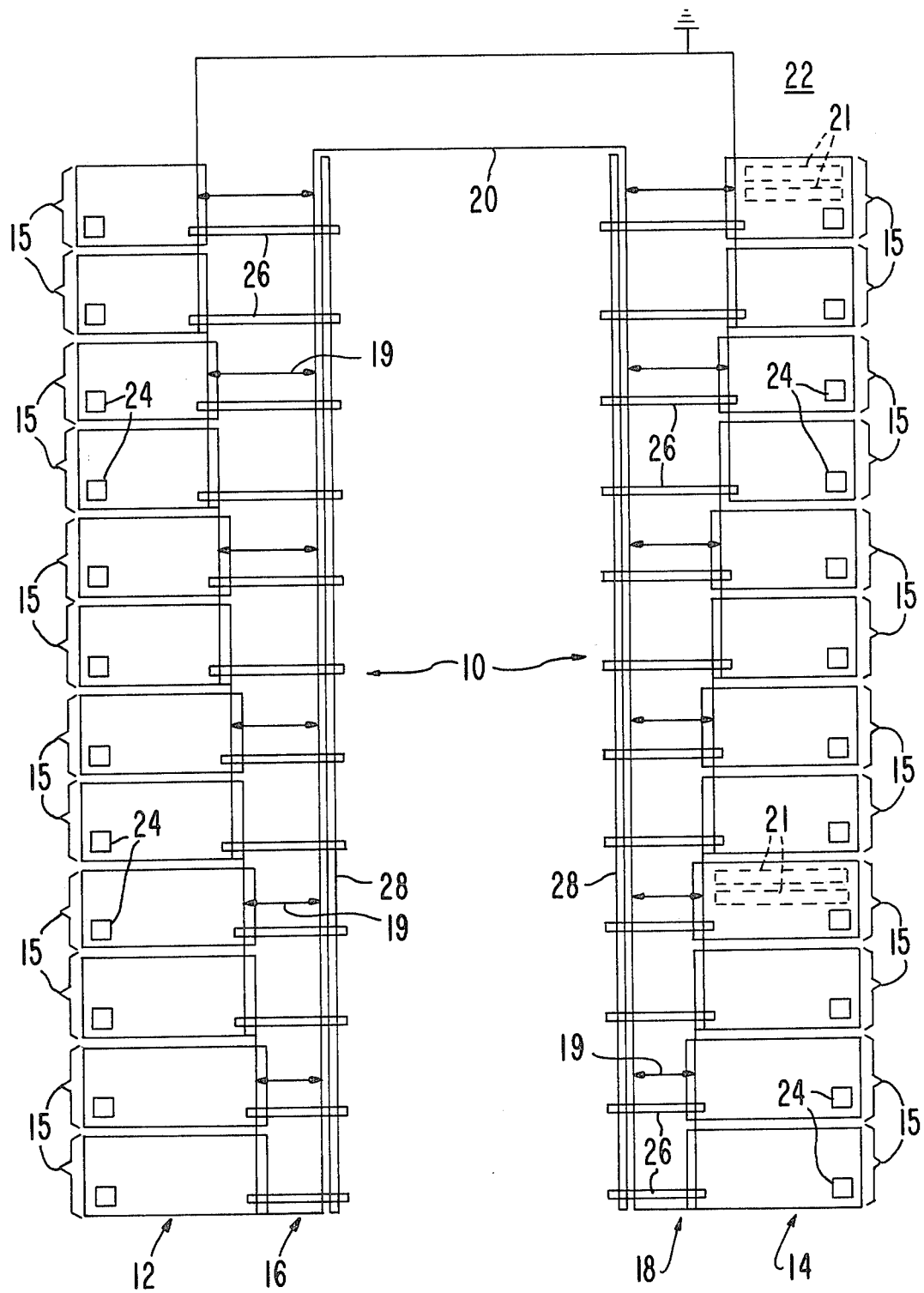
FIG. 1 is a plan view of a portion of an integrated circuit incorporating the invention.

Turning now to the drawings, more particularly to FIG. 1, there is shown a portion 10 of an integrated circuit in accordance with the invention. First and second columns 12 and 14 of output power transistor pairs 15 are located on either side of legs 16 and 18 of a generally U-shaped ground metallization 20, which is fabricated of aluminum, which may contain a small amount of copper in accordance with known practice in the semiconductor industry. Alternatively, metallization 20 could be gold or any other conductive metal conventionally used for this purpose. Each of the transistor pairs 15 is provided by the use of doped regions in a semiconductor substrate 22, in accordance with conventional techniques in integrated circuits. An oxide or other insulating layer (not shown) is provided over the semiconductor substrate 22, except where ohmic contact to the substrate 22 or doped regions within the substrate 22 is desired. Metallization layer 20 is then provided over the insulating layer, and makes ohmic contact with the transistor pairs 15 through contact openings (not shown) in the insulating layer. Contacts 24 provide output signals from the transistor pairs 15.

The legs 16 and 18 of the metallization 20 have a decreasing width moving downward along their length as indicated by arrows 19. Their width decreases in stepwise fashion for each of the transistor pairs 15. Correspondingly the emitters 21 of output transistor pairs 15 increase in their length, each pair moving downward along the legs 16 and 18 of metallization 20. As used herein, the term "emitter length" refers to the dimension of the emitter region 21 perpendicular to the legs 16 and 18 of the metallization 20. The increases in emitter length of the transistor pairs 15, therefore, correspond to the decreases in width of the legs 16 and 18, so that the combination of each metallization leg 16 and 18 and its associated transistor pairs 15 forms a rectangular shape. As a result, other rectangular integrated circuit elements (not shown) may be laid out efficiently around the metallization 20 and the transistor pair 15. Additionally, horizontal N+ diffusions 26 have decreasing lengths corresponding to the decreasing widths of legs 16 and 18. The N+diffusions 26 intersect with vertical isolation diffusions 28 in a conventional manner.

Figure 2:
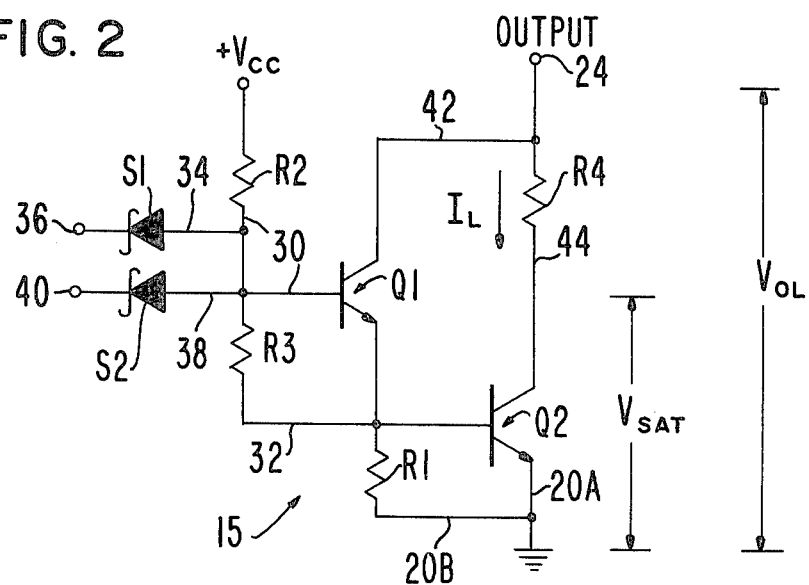
FIG. 2 is a circuit schematic diagram of an embodiment of the invention.

FIG. 2 shows a circuit schematic of a Darlington transistor pair 15, useful for a further understanding of the invention. Transistors Q1 and Q2 have their emitters connected to ground by lines 20A and 20B, the latter including resistor R1. Lines 20A and 20B correspond to the metallization 20 in FIG. 1. The base of transistor Q1 is connected by line 30 and resistor R2 to a source of positive potential $V_{cc}$. The base of transistor Q2 is also connected by line 32, resistor R3, line 30 and resistor R2 to the source of positive potential $+V_{cc}$. Schottky diode S1 and line 34 connect input 36 to line 30. Schottky diode S2 and line 33 connect input 40 to line 30. Line 42 connects the collector of transistor Q1 to output terminal 24 of the circuit, and line 44 connects the collector of transistor Q2 through resistor R4, representing the resistance of line 44 and terminal 24 embodied in integrated circuit form at saturation of Q2, to output terminal 24 of the circuit.

Figure 3:
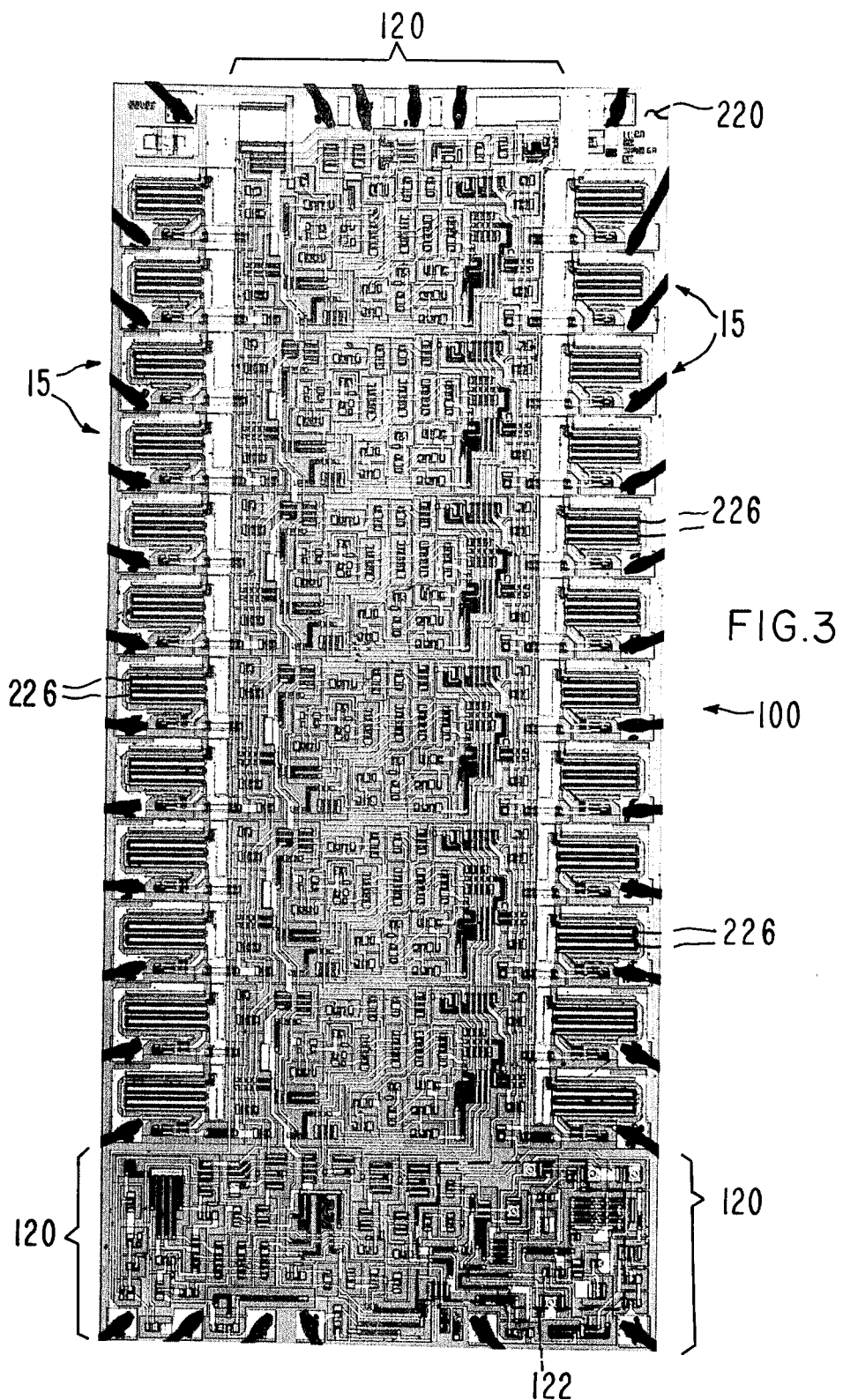
FIG. 3 is an enlarged photographic plan view of an embodiment of an integrated circuit incorporating the invention.
Figure 4:
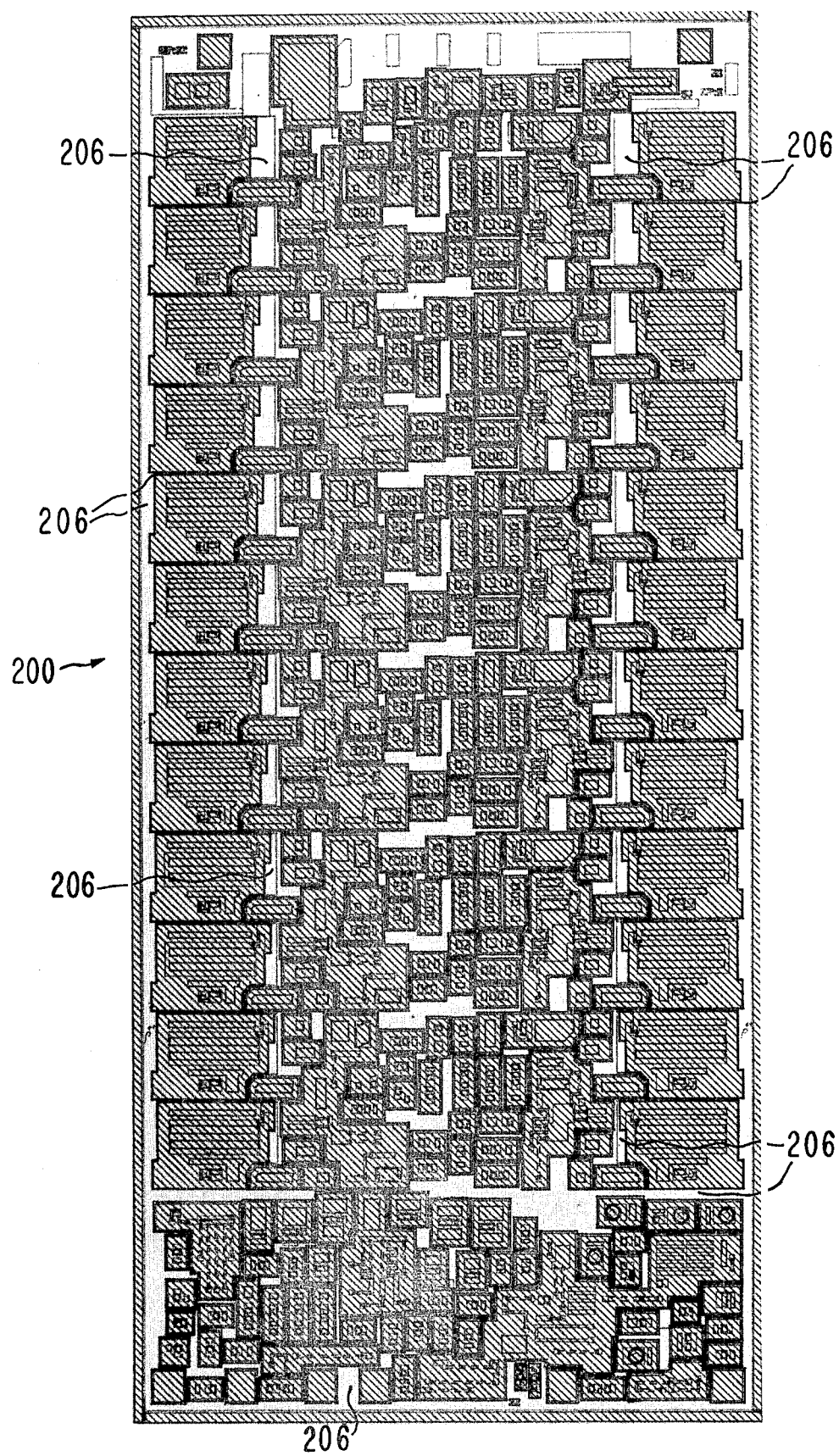
FIG. 4 is an enlarged plan view of a diffusion mask pattern for modification of the embodiment of the invention shown in FIG. 3.

In the integrated input embodiment of FIGS. 1, 3 and 4, the resistors of FIG. 2 have the following values:

| Resistor | Ohms |
| --- | --- |
| R1 | 10K |
| R2 | 8K |
| R3 | 10K |
| R4 | 4 ± 20% from top to bottom of array (FIGS. 3 & 5) |

In operation, load current $I_L$ flows through transistor Q2 to ground in response to control inputs supplied at terminals 36 and 40. When the transistor Q2 is fully turned on, there is a voltage drop $V_{SAT}$ across it. An output voltage $V_{OL}$ is developed between output terminal 24 and ground. It is the voltage $V_{OL}$ which is kept uniform among the transistor pairs 15 through use of this invention.

FIG. 3 is an enlarged photograph of a Darlington power transistor pair array integrated circuit 100, embodied as a thermal printhead driver, which incorporates the invention. The Darlington transistor pairs 15 are arranged along the sides of the integrated circuit, in the same general pattern as shown in FIG. 1. Emitter metallization contacts 226 extend from the ground metallization conducting lines 20 and make ohmic contact to emitter regions 228 (FIG. 8) through conventional contact openings in oxide 220.

The remainder of the integrated circuit 100 comprises various input and control circuits 120 for the thermal printhead driver integrated circuit 100. These input and control circuits 120 are, for the most part, conventional and known to those skilled in the art. An exception is the supply voltage sense amplifier circuits 122, which are the subject of the above-referenced, concurrently filed Kuo "Supply Voltage Sense Amplifier" application, the disclosure of which is incorporated by reference herein.

It should be noted that, because of the layout of the Darlington transistor pairs 15 and their associated ground metallization 20 in accordance with this invention so that the decreasing emitter lengths of the Darlington transistor pairs 15 running from the bottom to the top of FIG. 3 are compensated for by an increasing width of the metallization 20 running from the bottom to the top of FIG. 3, the remaining space in the integrated circuit 100 consists of an inverted T-shape, or two rectangles. This allows the input and control circuits 120 to be laid out efficiently without waste of surface area in the integrated circuit 100.

If the Darlington transistor pairs 15 are laid out with uniform emitter lengths and the metallization 20 has a uniform width along its length, the voltage drop running along the length of the metallization would be 165 millivolts with all six transistor pairs 15 turned on simultaneously at 100 milliamps of current each. If the metallization 20 increases in width from 0.003 inch at the bottom to 0.0055 inch at the top, in accordance with the prior art, this worst case voltage drop can be reduced to 130 millivolts.

In contrast, using the same increase in width from bottom to top of the metallization 20 and employing a decrease in emitter length of the Darlington transistor pairs to compensate for the increase in width of the metallization 20 reduces voltage mismatching from top to bottom of the Darlington transistor pair array to 40 millivolts. This substantial reduction in voltage mismatch occurs because the difference in turn-on voltage drop between top and bottom transistor pairs 15 in the array tends to compensate for the metallization voltage difference from the top to the bottom of the conducting lines 20. At the same time, the overall shape of the Darlington transistor pair arrays and their conducting lines is rectangular, thus allowing most efficient layout of the remainder of the integrated circuit.

The integrated circuit shown in FIG. 3 achieves the above results. A modification to that integrated circuit assures that the circuit will operate properly under a wider range of applied signals. FIG. 4 is a plan view of an integrated circuit diffusion mask pattern 200 useful for providing P++ diffusions 202 (FIG. 6), contained within P+ isolation regions 204, and to be discussed further below. Such P++ diffusions 202 are formed in the portions of a silicon semiconductor substrate corresponding to the white areas 206 shown in FIG. 4, in accordance with photolithographic techniques known in the art for fabrication of integrated circuits. As shown, the width of the white areas 206 near the top of the mask 200, as shown, are wider than the white areas 206 near the bottom of the mask 200, in a manner corresponding to the decrease in width of metallization 20 in FIG. 3. These areas are used to form ground contacts in the circuit, as explained more fully below.

Figure 6:
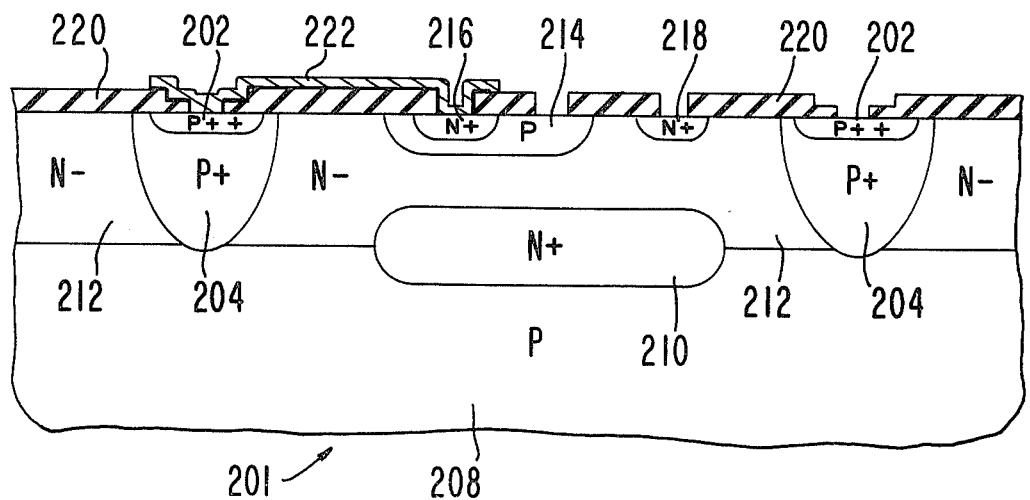
FIG. 6 is a generalized cross-section of the integrated circuit of FIG. 5.
Figure 5:
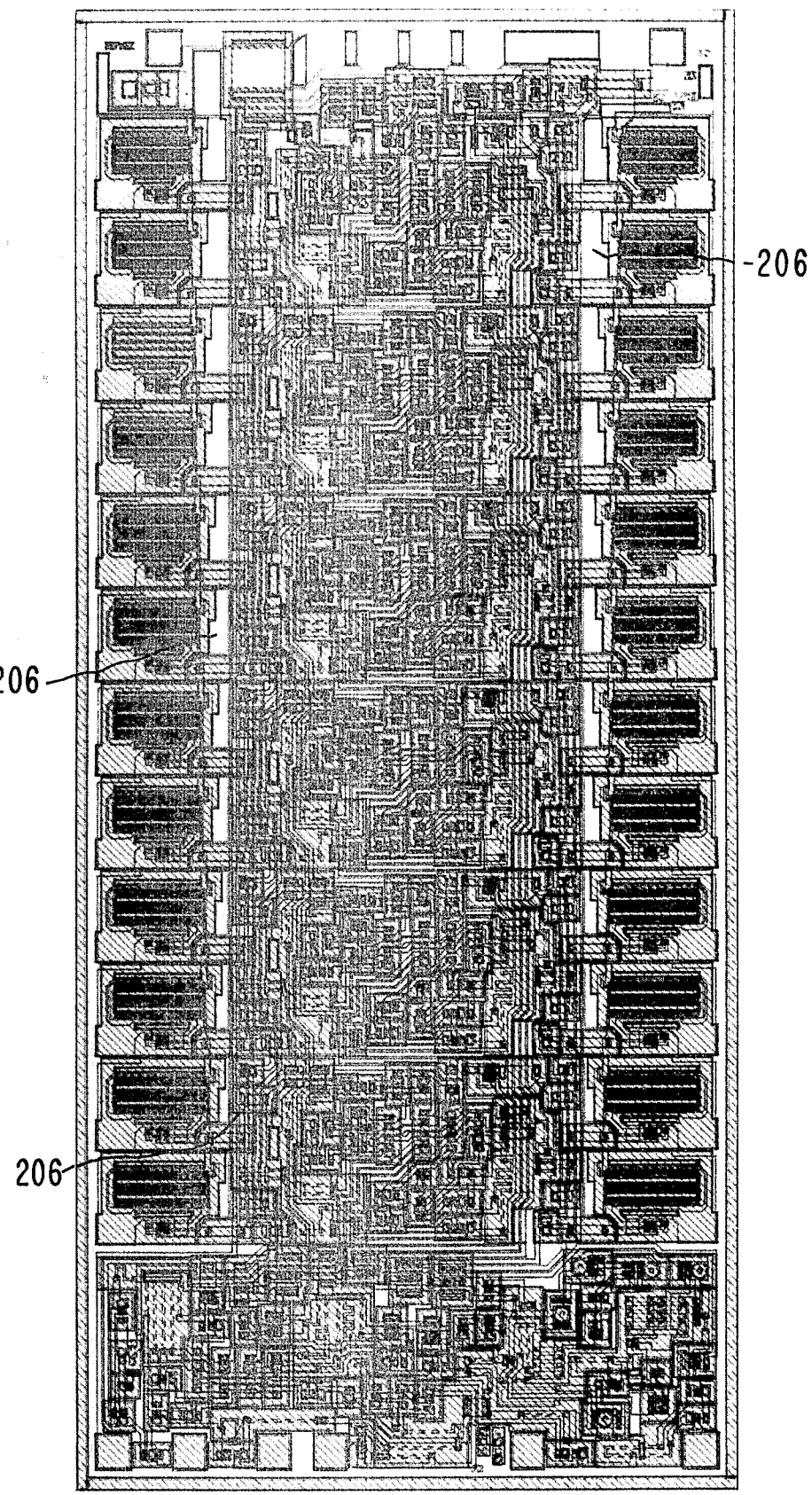
FIG. 5 is an enlarged plan view of a partially fabricated integrated circuit in accordance with the invention.

FIG. 5 is a corresponding plan view of a composite of the mask patterns used to fabricate an integrated circuit having the P++ diffusions 202 shown in FIG. 6 which represents a generalized cross-section of the resulting integrated circuit. Other than the presence of the openings 206 for formation of the P++ regions 202, the patterns in FIG. 5 correspond to those utilized to produce the integrated circuit shown in FIG. 3.

Turning now to the integrated circuit cross-section of FIG. 6, the fabrication of an integrated circuit 201 including the elements shown in that cross-section will be explained. The starting material for fabrication of the integrated circuit is a silicon substrate 208 of P-type semiconductor material and having a resistivity of 10 to 20 ohm-centimeters. N+ buried layer 210 is formed in substrate 208 by diffusing an N-type impurity, such as antimony, into substrate 208. The sheet resistance of buried layer 210 is typically about 30 to 40 ohms per square. An N-epitaxial layer 212 is then grown over substrate 208 and N+ buried layer 210, typically by either the well known silane or dichlorosilane process. The epitaxial layer 212 contains the circuit elements of the integrated circuit 201. The N-type dopant material for epitaxial layer 212 is typically phosphorus. The resistivity for the epitaxial layer 212 is about 1 to 1.5 ohm-centimeters.

P+ isolation regions 204 are then formed by diffusing a P-type impurity, such as boron, into the N− epitaxial layer 212, deeply enough so that the P+ regions 204 extend into P-type substrate 208. The sheet resistance of isolation regions 204 is about 20 to 100 ohms per square.

P-type base region 214 is then formed in N−epitaxial layer 212, also by diffusion of boron, but at a lower dopant concentration level, to produce a sheet resistance of about 100 to 150 ohms per square.

N+ emitter region 216 and N+ collector contact 218 are then simultaneously formed by diffusing an N-type impurity, such as phosphorus, into the base region 214 and epitaxial layer 212, respectively, to give a sheet resistance for these regions of approximately 10 ohms per square.

As a result of subsequent diffusions and other heating steps in the fabrication of the integrated circuit 201, the P-type dopant concentration at the surface of isolation regions 204 tends to be depleted. The final diffusion step in the fabrication of integrated circuit 201 is to form the P++ regions 202 at the surface of isolation regions 204. The regions 202 are also formed by diffusion of boron to give a sheet resistance of about 10 ohms per square for these regions.

To complete fabrication of the integrated circuit 201, oxide layer 220 is then thermally grown over the N-epitaxial layer 212 and various diffusions, contact openings are made where ohmic contact to the diffusions is desired, and aluminum or other suitable contact metallization 222 is deposited in a desired interconnection pattern, such as shown in FIG. 3, all utilizing conventional techniques known in the art of fabricating integrated circuits. Contact metallization 222 is deposited and etched at the same time as ground metallization 20 (FIG. 1).

Figures 7, 8, 9:
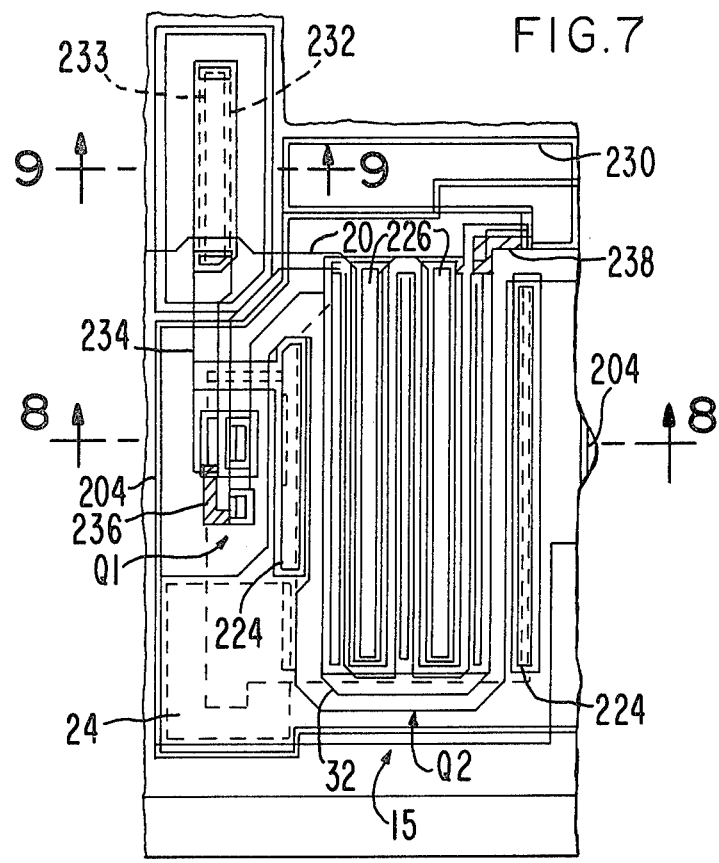
FIG. 7 is an enlarged plan view of the portion 7 of the integrated circuit shown in FIG. 5, but showing the completed circuit.
FIG. 8 is a cross-section taken along the line 8—8 in FIG. 7.
FIG. 9 is a cross-section view taken along the line 9—9 in FIG. 7.

FIGS. 7 and 8 show the layout of a Darlington output transistor pair 15 in accordance with the invention. Isolation diffusions 204 and P++ diffusion 202 correspond to those shown in FIG. 6. However, unlike the circuit portion shown in FIG. 6, contact to the P++ diffusion 202 is not required at the Darlington pairs 15. Transistors Q1 and Q2 (see also FIG. 2) are, respectively, to the left and right of the layout and cross-section of FIGS. 7 and 8. Similarly, buried N+ layer 210 corresponds to that shown in FIG. 6 and (together with N-epitaxial layer 212) forms the collectors of both transistors Q1 and Q2. Collector contacts 224 serve to connect the collectors of each transistor to the output terminal 24. Emitter contacts 226 serve to connect emitters 228 to ground metallization 20. Ground contacts 230, comprising certain of diffused regions 204 and 202, extend downward to substrate 208, and are provided at each Darlington pair 15 to ensure proper grounding of metallization 20 (see also FIGS. 3 and 5).

The cross-section view of FIG. 9 and FIG. 7 show how sinker diffusion 232 is utilized to bridge the input Schottky diodes S1 and S2 to the base of transistor Q1, also via metallization 234. FIG. 9 further shows the structure of diffusions 204 and 202, comprising the ground contacts 230. Ion implanted region 236 beneath insulating layer 220 comprising resistor R3, together with metallization layer 32, connects the base of transistor Q1 to the base of transistor Q2. A similar ion implanted region 238 forms the resistor R1. As in the FIG. 6 cross-section, P+ diffusions 204 and P++ diffusions 202 contained within them provide a low resistance connection for ground contacts 230 to substrate 208. Sinker diffusions 232 also vary in length for the transistor pairs 15, running from the top to bottom of the array shown in FIGS. 3 and 5. The ground contacts 230 also vary in width running from the top to bottom of the array as shown in FIGS. 3 and 5.

Figure 10:
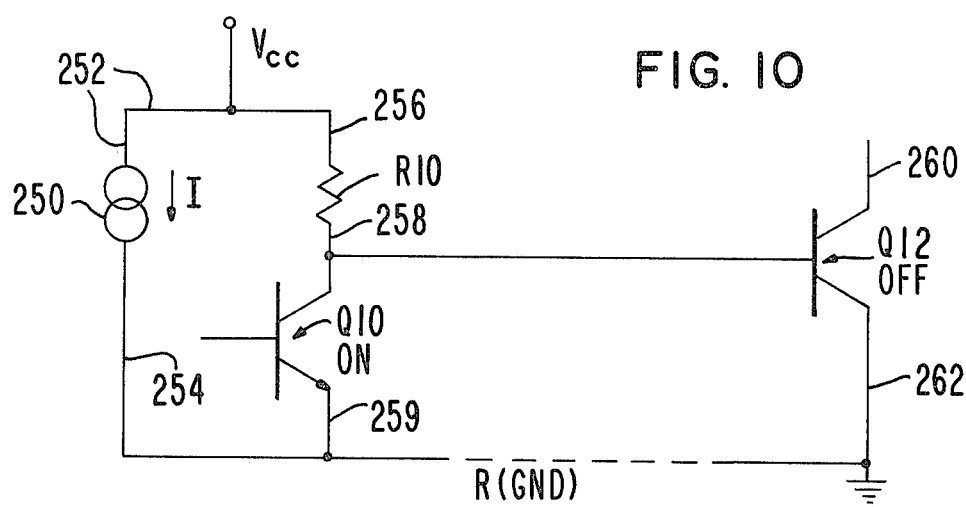
FIG. 10 is a circuit schematic diagram useful for understanding the embodiment of FIGS. 4 through 9.

The result of providing the P++ regions 202 in isolation regions 204 of the integrated circuit 201 is to reduce the resistance of the circuit path to ground through metallization 222, regions 202, regions 204 and substrate 208, to from ⅓ to 1/6 of its typical value without the presence of the P++ regions 202. The significance of such a reduction in ground resistance in the integrated circuit 201 may be appreciated with the assistance of the circuit schematic shown in FIG. 10. As shown, the source 250 of current I is connected between positive potential $V_{cc}$ and ground by lines 252 and 254. An additional current flow path to ground is provided by line 256, resistor R10, line 258, transistor Q10, line 259, and line 254. Transistor Q12 forms part of another current flow path to ground, also including lines 260 and 262.

When implemented in integrated circuit form, if transistor Q10 is located substantially further away from the ground connection of the integrated circuit than transistor Q12, there is a substantial danger of improper operation unless the value of R(GND), which represents the effective ground impedance between transistors Q10 and Q12 through the isolation regions 204 (FIG. 6), with current I, the equivalent circuit current feeding into ground adjacent to transistor Q10, is reduced.

In order for transistor Q12 to be off while transistor Q10 is on, the following condition must be met. $V_{sat}$ of transistor Q10 plus IR(GND) must be less than the base-to-emitter voltage $V_{be}$ of transistor Q12. This condition can be easily violated if either I or R(GND) is too large. The presence of P++ surface diffusions 202 in isolation regions 204 serves to reduce R(GND) to from ⅓ to 1/6 of its value in the absence of diffusions 202. Implementing this technique in the integrated circuit of FIG. 3 gives the integrated circuit layout represented by the overlay composite shown in FIG. 5. The resulting integrated circuit has a substantially simpler layout than a corresponding integrated circuit in which all of the transistor emitters to be connected to ground are so connected by metallization alone, the only alternative for obtaining equivalent circuit performance. As a result, an integrated circuit with the layout of FIG. 5 is capable of achieving the demanding requirements for supplying operating currents to thermal printhead drive elements.

The improved ground connection of this invention can be used in other digital and analog circuit layout designs in a similar manner to eliminate such ground loop problems as discussed above in connection with FIG. 10, to simplify the integrated circuit layout design when compared with an all metal ground connection, and thereby reduce integrated circuit chip size for equivalent performance.

It should now be apparent to those skilled in the art that an integrated circuit power transistor array capable of achieving the stated objects of the invention has been provided. Uniformity of driving outputs is achieved while maintaining a rectangular shape for the power transistor array and its conductor, thus allowing efficient layout.

While the invention is particularly useful for Darlington transistor pairs in a thermal printhead driver integrated circuit, the above discussed advantages of the invention make it of use for other types of driver circuits, such as display drivers, memory drivers, high-current peripheral drivers, and the like. The invention may also be used with other arrays of multiple transistor combinations than Darlington pair tranisistors, as well as with arrays of single power transistors. The invention further may be used with other types of transistors than bipolar transistors, such as field effect transistors, and the like.

It should further be apparent to those skilled in the art that various changes in the form and details of the invention as shown and described may be made. It is intended that such changes be included within the spirit and scope of the claims appended hereto.

What is claimed is:

1. An integrated circuit comprising an array of transistors formed in a common semiconductor substrate each having an electrode formed by a region in said semiconductor substrate connected to a conductive line forming a part of said integrated circuit, the electrodes of said transistors being spaced along said conductive line and the regions in said substrate forming each electrode of said transistors decreasing in length in a given direction along said conductive line, said conductive line increasing in width in the given direction to reach the regions forming each electrode, the decrease in length of the regions forming the electrodes and the increase in width of said conductive line being such that the electrodes and said conductive line form a generally rectangular shape.

2. The integrated circuit of claim 1 in which said transistors are bipolar transistors and the electrodes are emitters.

3. The integrated circuit of claim 2 in which said transistor array comprises a plurality of Darlington power transistor pairs.

4. The integrated circuit of claim 1, 2 or 3, in which the electrodes are formed substantially orthogonally to said conductive line.

5. The integrated circuit of claim 4 in which each electrode has an ohmic contact extending substantially orthogonally to said conductive line.

6. The integrated circuit of claim 1, 2 or 3, in which said conductive line is connected to a predetermined potential.

7. The integrated circuit of claim 1 in which the integrated circuit is a thermal printhead driver and said transistors are output driver transistors.

8. The integrated circuit of claim 1 additionally comprising a plurality of doped regions extending beneath said conductive line between an isolation region running along said conductive line and said transistors, said plurality of doped regions having an increasing length corresponding to the increasing width of said conductive line.

9. The integrated circuit of claim 1 or 8, additionally comprising a plurality of ground contacts ohmically connecting said conductive line to circuit ground, said ground contacts being spaced along said conductive line and having a decreasing width corresponding to the increasing width of said conductive line.

10. The integrated circuit of claim 1 or 8 additionally comprising a plurality of sinker regions each connected to a plurality of buried regions in said integrated circuit passing beneath said conductive line, said sinker regions and buried regions connected to the transistors of said array, said sinker regions and buried regions being spaced along said conductive line, said buried regions having an increasing length corresponding to the increasing width of said conductive lines.

11. In combination, in an integrated circuit, a plurality of transistors formed in a common substrate and each having electrodes extending from a conductive line forming part of the integrated circuit, said conductive line being shaped to define a first generally trapezoidal shape having a relatively wide end and a relatively narrow end so that said conductive line has an increasing width from the relatively narrow end to the relatively wide end of the first generally trapezoidal shape, and the electrodes having an increasing length moving along the first trapezoidal shape from the relatively wide end to the relatively narrow end, the electrodes of said transistors defining a second generally trapezoidal shape having a relatively wide end and a relatively narrow end, the relatively wide end of said second generally trapezoidal shape being proximate to the relatively narrow end of said first generally trapezoidal shape, and the relatively wide end of said first generally trapezoidal shape being proximate to the relatively narrow end of said second generally trapezoidal shape.

12. The combination of claim 11 in which said transistors are bipolar transistors and the electrodes are emitters.

13. The combination of claim 12 in which said transistors each comprise a corresponding transistor in a plurality of Darlington power transistor pairs.

14. The combination of claim 11, 12 or 13 in which the electrodes are formed substantially orthogonally to said conductive line.

15. The combination of claim 14 in which each electrode has an ohmic contact extending substantially orthogonally to said conductive line.

16. The combination of claim 11, 12 or 13 in which said conductive line is connected to a predetermined potential.

17. The combination of claim 11 in which the integrated circuit is a thermal printhead driver and said transistors are output driver transistors.

18. The combination of claim 11 additionally comprising a plurality of doped regions extending beneath said conductive line between an isolation region running along said conductive line and said transistors, said plurality of doped regions having an increasing length corresponding to the increasing width of said conductive line.

19. The combination of claim 11 or 18 additionally comprising a plurality of ground contacts ohmically connecting said conductive line to circuit ground, said ground contacts being spaced along said conductive line and having a decreasing width corresponding to the increasing width of said conductive line.

20. The combination of claim 11 or 18, additionally comprising a plurality of sinker regions each connected to a plurality of buried regions in said integrated circuit passing beneath said conductive line, said sinker regions and buried regions connected to the transistors of said array, said sinker regions and buried regions being spaced along said conductive line, said buried regions having an increasing length corresponding to the increasing width of said conductive line.

* * * * *